United States Patent [19]

Nishimura et al.

[11] Patent Number: 4,694,143
[45] Date of Patent: Sep. 15, 1987

[54] ZONE MELTING APPARATUS FOR MONOCRYSTALLIZING SEMICONDUCTOR LAYER ON INSULATOR LAYER

[75] Inventors: Tadashi Nishimura; Kazuyuki Sugahara; Shigeru Kusunoki; Yasuo Inoue, all of Itami, Japan

[73] Assignee: Mitsubishi Denki Kabushiki Kaisha, Tokyo, Japan

[21] Appl. No.: 815,069

[22] Filed: Dec. 31, 1985

[30] Foreign Application Priority Data

Feb. 26, 1985 [JP] Japan .................................. 60-39590

[51] Int. Cl.$^4$ ....................... H05B 3/64; F27D 11/00; F27B 5/14
[52] U.S. Cl. .................................. 219/388; 219/405; 219/411; 118/725
[58] Field of Search ............... 219/388, 390, 411, 405, 219/354; 118/50.1, 724, 725, 728; 148/1.5

[56] References Cited

U.S. PATENT DOCUMENTS

| | | | |
|---|---|---|---|
| 2,629,162 | 2/1953 | Peck | 219/388 |
| 3,836,751 | 9/1974 | Anderson | 219/405 |
| 4,160,893 | 7/1979 | Meyen | 219/343 |
| 4,331,485 | 5/1982 | Gat | 148/1.5 |
| 4,395,433 | 7/1983 | Nagakubo | 148/1.5 |

OTHER PUBLICATIONS

"Zone-Melting Recrystallization of Encapsulated Silicon Films on SiO$_2$-Morphology and Crystallography", Appl. Phys. Lett., 40(1982)158, by M. W. Geis et al.

*Primary Examiner*—E. A. Goldberg
*Assistant Examiner*—Teresa J. Walberg
*Attorney, Agent, or Firm*—Lowe Price Leblanc Becker & Shur

[57] ABSTRACT

A zone melting apparatus, in accordance with the present invention for monocrystallizing a semiconductor layer in a layered substance, includes: an upper elongated heater for zone melting of the semiconductor layer, the upper heater being disposed above and parallel to the semiconductor layer; a plurality of lower elongated heaters for heating the whole layered substance, the lower heaters being disposed in a plane below and parallel to the layered substance and the axis of each of the lower heaters being substantially perpendicular to the axis of the upper heater; a plurality of power suppliers for supplying electric power to the lower heaters; one or more temperature sensors for estimating the temperature of the layered substance; and a controller for controlling the power suppliers in response to the output of the temperature sensor(s), the controller making control so that the temperature of the central portion of the layered substance is slightly lower than that of the outer portions thereof.

15 Claims, 6 Drawing Figures

ZONE MELTING APPARATUS FOR MONOCRYSTALLIZING SEMICONDUCTOR LAYER ON INSULATOR LAYER

BACKGROUND OF THE INVENTION

1. Field of the Invention

The present invention relates to a zone melting apparatus and particularly to a zone melting apparatus for monocrystallizing a thin semiconductor layer on an insulator layer.

2. Description of the Prior Art

Referring to FIG. 1, an example of a conventional zone melting apparatus is schematically illustrated (see "Zone-melting recrystallization of encapsulated silicon films on SiO$_2$-morphology and crystallography", Appl. Phys. Lett., 40(1982)158, by M. W. Geis et al.). A lower heater 11 such as a carbon plate supports a wafer 13 to be described afterwards. An upper elongated linear heater 12 moves slowly above the wafer 13 in the direction of the arrow 10.

FIG. 2 shows a layered structure of the wafer 13 including a thin polycrystalline or amorphous silicon layer to be monocrystallized. On an upper major surface of a monocrystalline silicon substrate 15, a silicon dioxide layer 16 of approximately 0.5 μm in thickness is formed and on this layer 16, a polycrystalline silicon layer 17 of approximately 0.5 μm in thickness to be monocrystallized by zone melting is formed. Further on the polycrystalline silicon layer 17, protection layers comprising a silicon dioxide layer 18 of approximately 2 μm and a silicon nitride layer 19 of approximately 30 nm is formed. The protection layers serve to protect the silicon layer 17 from the environment and to reduce the influence of the surface tension of the silicon layer 17 subjected to the zone melting.

In the operation for monocrystallizing the polycrystalline silicon layer 17, the wafer 13 is heated to 1200° C. by the lower heater 11. The upper elongated heater 12 at 2000° C. located at a height of approximately 1mm to 2 mm from the top surface of the wafer moves from one end of the wafer 13 in the direction shown by the arrow 10 at a rate of, for example, 2 mm/sec, so as to sweep the whole area of the wafer 13. During the sweeping, the silicon layer 17 is melted in a linear zone 14 directly below the elongated heater 12. The melting zone 14 moves throughout the silicon layer 17 according to the movement of the upper elongated heater 12, whereby the silicon layer 17 in the wafer 13 is monocrystallized. This monocrystallizing operation is performed in an atmosphere of inert gas such as argon.

FIG. 3 is a schematic illustration showing another conventional zone melting apparatus. A wafer 30 as shown in FIG. 2 is provided on a wafer support plate 36. A zone melting tubular lamp 22 with a convergent mirror 220 is provided above and parallel to the wafer 30. The convergent mirror 220 focuses the light from the tubular lamp 22 linearly onto the polycrystalline silicon layer 17 in the wafer 30 so that a linear melting zone is formed in the silicon layer 17.

Wafer heating tubular lamps 21a, 21b, 21c, 21d and 21e are provided in a plane below and parallel to the wafer support plate 36 and have reflection mirrors 210a, 210b, 210c, 210d and 210e, respectively. These wafer heating tubular lamps 21a to 21b are disposed with equal spacings between them and parallel to the zone melting tubular lamp 22. The reflection mirrors 210a to 210e reflect respectively the light from the wafer heating lamps 21a to 21e toward the support plate 36 so as to prevent scattering loss of the light. The light from the wafer heating lamps 21a to 21e irradiates and heats the whole surface of the support plate 36 so that the whole area of the wafer 30 is heated. In such an apparatus as described above, a relatively large number of wafer heating tubular lamps are provided so as to heat the wafer 30 uniformly.

In the operation, the wafer 30 along with the wafer heating tubular lamps 21a to 21e moves relatively to the zone melting tubular lamp 22 in the direction shown by the arrow 120. The arrow 120 is normal to the axis of each of the wafer heating tubular lamps 21a to 21e. During the movement of the wafer 30, the light from the zone melting tubular lamp 22 irradiates linearly the silicon layer 17 in the wafer 30 so as to sweep the whole area of the wafer 30. During the sweeping, the linear melting zone moves in the silicon layer 17 from an edge to the opposite edge thereof between the upper and lower silicon dioxide layers 18 and 16, whereby the silicon layer 17 is monocrystallized.

In a practical application of zone melting by such a conventional apparatus as described above, since the wafer is heated from both of the upper and lower sides, heat cannot easily escape from the central portion of the wafer and therefore, the silicon layer 17 in the wafer having a large area of more than 4 inches in diameter cannot be monocrystallized by one pass of zone melting. In other words, in such a conventional apparatus, it is difficult to obtain a monocrystalline layer that is homogeneous over the whole area because it sometimes happens that even if the central portion of the silicon layer 17 is melted, the edge portions thereof are not melted or, if the edge portions of the silicon layer 17 are melted, the central portion thereof is heated excessively.

SUMMARY OF THE INVENTION

A principle object of the present invention is to provide a zone melting apparatus by which a homogeneous monocrystalline semiconductor layer having a large area can be formed on an insulator layer.

A zone melting apparatus in accordance with the present invention for monocrystallizing a semiconductor layer deposited on an insulator layer comprises: a support plate for supporting said layered substance; an upper elongated heater for zone melting of said semiconductor layer, said upper elongated heater being disposed above and parallel to said semiconductor layer; a plurality of lower elongated heaters for heating the whole of said layered substance, said lower elongated heaters being disposed in a plane below and parallel to said support plate and the axis of each of said lower heaters being substantially perpendicular to the axis of said upper heater; a plurality of power suppliers for supplying electric power to said lower heaters; one or more temperature sensors provided at one or more predetermined positions of said support plate for estimating the temperature of said layered substance; a controller for controlling said power suppliers in response to the output of said temperature sensor(s), said controller controlling said power suppliers to supply a larger electric power to the outer ones of said lower heaters than to the inner ones, whereby the temperature in the center of said layered substance is a little lower than that in the end portions thereof; and means for moving said upper heater relatively to said layered substance in the axial direction of each of said lower heaters.

Using a zone melting apparatus in accordance with the present invention, a semiconductor layer on an insulator layer has a fixed temperature in the sweeping direction for zone melting, while in the direction perpendicular to the sweeping direction, the semiconductor layer has a preferred temperature distribution where the temperature in the central portion of the semiconductor layer is slightly lower than that in both of the edge portions thereof. Thus, a semiconductor monocrystal layer of an equal quality having a large area can be formed on an insulator layer.

These objects and others objects, features, aspects and advantages of the present invention will become more apparent from the following detailed description of the present invention when taken in conjunction with the accompanying drawings.

DESCRIPTION OF THE EMBODIMENTS

Figure 1:
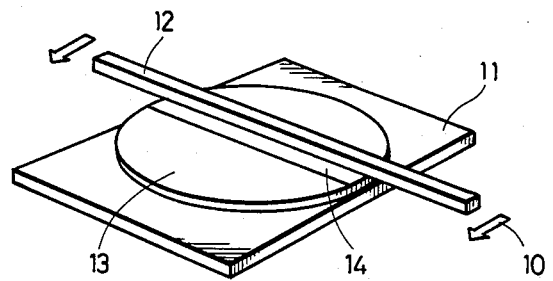
FIG. 1 is a schematic illustration of a conventional zone melting apparatus using carbon heaters.
Figure 2:
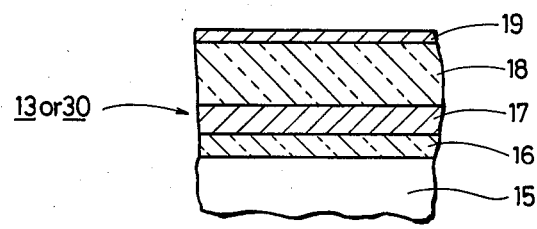
FIG. 2 is a partial sectional view of a wafer including a semiconductor layer to be monocrystallized on an insulator layer.
Figure 3:
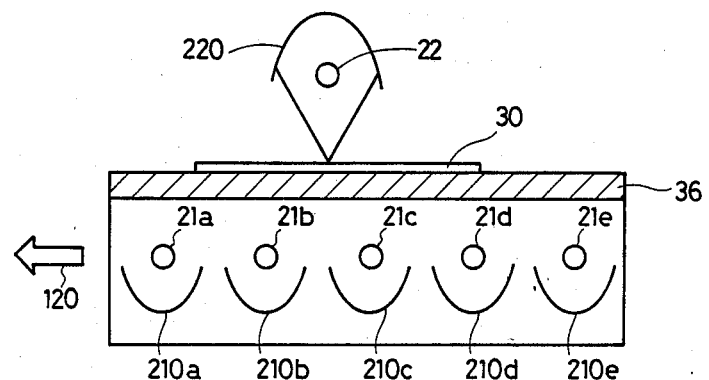
FIG. 3 is a schematic illustration of a conventional zone melting apparatus using tubular lamps.
Figure 4:
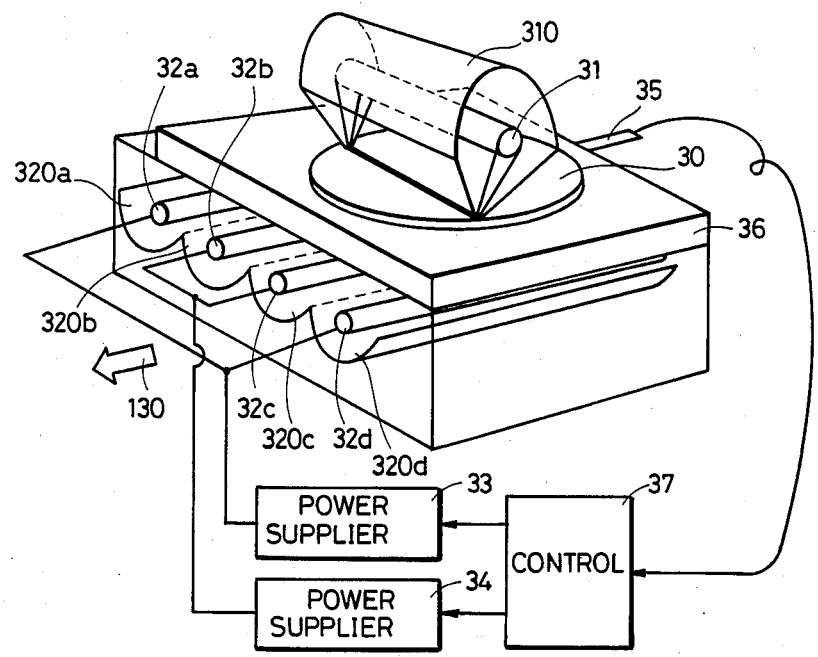
FIG. 4 is a schematic illustration showing a zone melting apparatus of an embodiment of the present invention.

Referring to FIG. 4, a zone melting apparatus of an embodiment of the present invention is schematically illustrated. A wafer support plate 36 is a rectangular carbon plate of 6 mm to 10 mm in thickness. On the support plate 36, such a wafer 30 as shown in FIG. 2 is provided. A zone melting tubular lamp 31 provided with a convergent mirror 310 is located above and parallel to the wafer 30. The convergent mirror 310 focuses the light from the zone melting tubular lamp 31 linearly onto a polycrystalline silicon layer 17 in the wafer 30 so that the silicon layer 17 is melted in a linear zone between the upper and lower insulator layers 18 and 16, as best understood with reference to FIG. 2.

Under the support plate 36, a plurality of wafer heating tubular lamps 32a, 32b, 32c and 32d are provided parallel to each other with equal spacings between them. These wafer heating tubular lamps 32a to 32d exist in a plane parallel to the support plate 36 and are substantially perpendicular to the zone melting tubular lamp 31. The wafer heating lamps 32a to 32d have suitable reflection mirrors 320a, 320b, 320c and 320d, respectively. The reflection mirrors 320a to 320d reflect the light from the wafer respective wafer heating lamps 32a to 32d toward the support plate 36 so as to prevent scattering loss of the light.

A temperature sensor 35 for estimating the temperature of the wafer 30 is provided on the support plate 36 in the middle of an edge parallel to the zone melting tubular lamp 31. The temperature sensor 35 is connected to a control device 37 which is connected with power suppliers 33 and 34 for feeding the wafer heating lamps. The power supplier 33 is connected to the outer two wafer heating lamps (32a and 32d), while the power supplier 34 is connected to the inner two lamps (32b and 32c). More specifically, the outer lamps 32a and 32d are fed by the power supplier 33 independently of the inner lamps 32b and 32c which are fed by the supplier 34.

Figure 5:
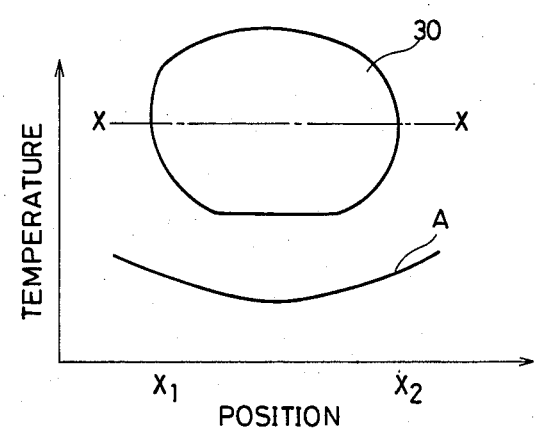
FIG. 5 is an illustration for explaining a temperature distribution in a wafer to be processed by a zone melting apparatus in accordance with the present invention.

The light radiations from the water heating lamps 32a to 32d irradiate and heat the whole surface of the support plate 36 so that the whole area of the wafer 30 is heated. At this time, the control device 37 controls the power suppliers 33 and 34 in response to the output from the temperature sensor 35. Under this control, the power supplier 34 for the outer lamps 32a and 32d feeds a somewhat larger amount power than the power supplier 33 for the inner lamps 32b and 32c. Thus, the temperature distribution in the wafer 30 in the axial direction of the zone melting tubular lamp 31 is set to an optimum condition, for example, as shown by a curve A in FIG. 5,. More specifically, the temperature of the wafer 30 is set to a condition in which the temperature at both edges is higher by 30° C. to 70° C. than that of the middle portion, with the temperature of the middle portion being 1280° C. to 1350° C. On the other hand, the temperature distribution of the wafer in the axial direction of the wafer heating tubular lamps can be maintained constant.

In this embodiment, the temperature sensor 35 is provided at a predetermined position in the support plate 36 to estimate the temperature of the wafer 30, so that a prescribed difference is provide by the controller 37 between the powers fed by the suppliers 33 and 34. However, in the alternative two temperature sensors for the suppliers 33 and 34 respectively may be provided at suitable positions on the support plate 36.

A moving device (not shown) moves the wafer 30 together with the wafer heating lamps 32a to 32d in the direction of the arrow 130 relatively to the zone melting lamp 31. The direction of the arrow 130 is parallel to the axis of each of the wafer heating tubular lamps 32a to 32d. Thus, the light from the zone melting tubular lamp 31 relatively sweeps the whole area of the wafer 30. It is needless to say that, in the alternative, the zone melting tubular lamp may be moved above the wafer while the wafer is held stationary.

Figure 6:
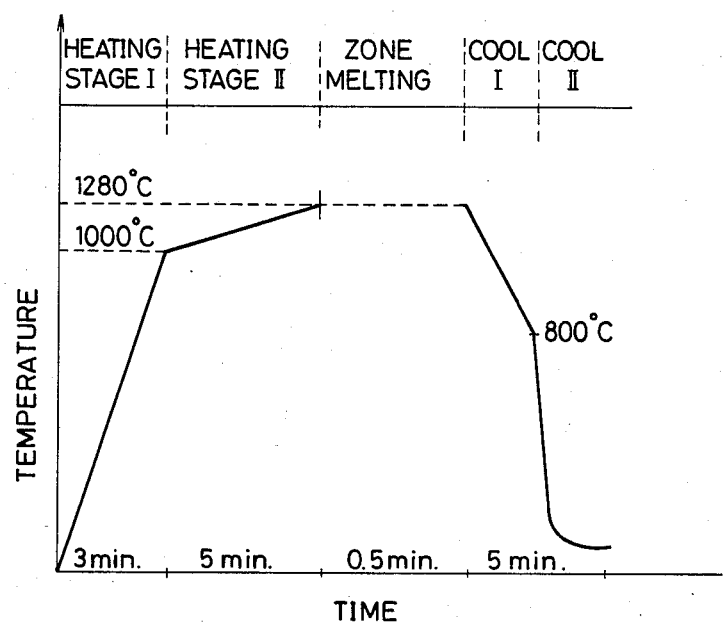
FIG. 6 is a graph showing the heating and cooling stages of a wafer to be processed by a zone melting apparatus in accordance with the present invention.

FIG. 6 shows several stages in the operation of the apparatus shown in FIG. 4. First, in the wafer heating stage I, the control device 37 controls the power suppliers 33 and 34 so that the wafer 30 may be rapidly heated up to approximately 1000° C. Then, the control device 36 decreases the power supplied by the suppliers 33 and 34 so that the wafer 30 may be slowly heated up to approximately 1280° C. When the temperature of the central portion of the wafer attains approximately 1280° C. to 1350° C., the control device 37 controls the power suppliers 33 and 34 so that the temperature at both edge portions of the wafer 30 is higher than the temperature of the central portion by approximately 30° C. to 70° C. best understood with reference to FIG. 5.

After that, the zone melting tubular lamp 31 irradiates and sweeps the wafer 30, for example at a rate of 0.5 cm/sec. The sweeping rate is preferably 0.1 cm/sec to 15 cm/sec. In this zone melting stage, the melting zone in the silicon layer 17 between the insulator layers 16 and 18 moves from an edge to the opposite edge of the wafer 30, whereby the silicon layer 17 is monocrystallized.

After the zone melting stage, the control device 37 decreases the power from the supplies 33 and 34 or turns off the suppliers 33 and 34 so that the wafer 30 may be cooled at a rate of approximately −2° C./sec. After the temperature of the wafer 30 is cooled to approximately 800° C., the wafer 30 is rapidly cooled down to the room temperature by means of a compulsive cooling device (not shown). The operation in all of the above described stages is performed in an atmosphere of $N_2$ gas or Ar gas.

Although in the above embodiment, monocrystallization of a polycrystalline silicon layer 17 is described, the semiconductor layer 17 may be an amorphous semiconductor layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A zone melting apparatus for monocrystallizing a semiconductor layer deposited on an insulator layer, comprising:
    a support plate for supporting a layered substance including said semiconductor layer and said insulator layer;
    an upper elongated heated for zone melting of said semiconductor layer, said upper heater being disposed above and parallel to said semiconductor layer;
    a plurality of lower elongated heaters for heating the whole of said layered substance, said lower heaters being disposed in a plane below and parallel to said support plate and the axis of each of said lower heaters being substantially perpendicular to the axis of said upper heater;
    a plurality of power suppliers for supplying predetermined amounts of electric power to individual heaters in said plurality of lower heaters;
    a temperature sensor disposed at a predetermined position in said support plate for generating an output corresponding to the temperature of said layered substance thereat;
    a controller for controlling said power suppliers in response to the output of said temperature sensor, said controller being capable of controlling said power suppliers to supply large amounts of electric power to those of said lower heaters located more remotely from the central portion to said layered substance than to those local heaters located closer to said central portion, whereby the temperature in said central portion of said layered substance is controlled to be lower than that in the outer edge portions of said layered substance; and
    means for moving said upper heater relative to said layered substance in the axial direction of said lower heaters.

2. A zone melting apparatus in accordance with claim 1, wherein:
    said lower heaters are disposed at equal intervals apart.

3. A zone melting apparatus in accordance with claim 2, wherein:
    said upper elongated heater is provided with a convergent reflector for focusing linearly the radiation from said upper elongated heater onto said semiconductor layer.

4. A zone melting apparatus in accordance with claim 3, wherein:
    said lower heaters are provided with individual reflectors for reflecting the radiation from said lower heaters toward said support plate.

5. A zone melting apparatus in accordance with claim 4, wherein:
    said upper heater is a tubular heating lamp.

6. A zone melting apparartus in accordance with claim 5, wherein:
    said lower heaters are tubular heating lamps.

7. A zone melting apparatus in accordance with claim 6, wherein:
    said support plate is a carbon plate.

8. A zone melting apparatus in accordance with claim 4, wherein:
    said upper heater is a resistance heater.

9. A zone melting apparatus in accordance with claim 8, wherein:
    said lower heaters are resistance heaters.

10. A zone melting apparatus in accordance with claim 9, wherein:
    said support plate is a carbon plate.

11. A zone melting apparatus in accordance with claim 4, wherein:
    the temperature in said central portion of said layered substance is controlled to be lower than the temperature in the outer edge portions of said layered substance by between 30° C. and 70° C.

12. A zone melting apparatus in accordance with claim 11, wherein:
    the temperature in said central portion of said layered substance is controlled to be in the range 1280° C. to 1350° C.

13. A zone melting apparatus in accordance with claim 1, wherein:
    said insulator layer is provided on an upper major surface of a semiconductor wafer.

14. A zone melting apparatus in accordance with claim 13, wherein:
    said semiconductor layer to be monocrystallized is a polycrystalline semiconductor.

15. A zone metlting apparatus in accordance with claim 13, wherein:
    said semiconductor layer to be monocrystallized is an amorphous semiconductor.

* * * * *